United States Patent
Choi et al.

(10) Patent No.: US 8,420,955 B2
(45) Date of Patent: Apr. 16, 2013

(54) LEAD PIN FOR PACKAGE SUBSTRATE

(75) Inventors: Jin Won Choi, Gyunggi-do (KR); Seung Jean Moon, Gyunggi-do (KR); Ki Taek Lee, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 320 days.

(21) Appl. No.: 12/805,413

(22) Filed: Jul. 29, 2010

(65) Prior Publication Data
US 2011/0067899 A1 Mar. 24, 2011

(30) Foreign Application Priority Data
Sep. 22, 2009 (KR) ........................ 10-2009-0089706

(51) Int. Cl.
*H05K 1/11* (2006.01)
*H05K 7/00* (2006.01)
*H01L 23/495* (2006.01)
*H01L 23/48* (2006.01)

(52) U.S. Cl.
USPC ........... 174/267; 257/667; 257/692; 257/697; 257/780; 257/781; 361/760

(58) Field of Classification Search .................. 174/267; 257/667, 697, 692, 780, 781; 29/842–845; 361/760
See application file for complete search history.

(56) References Cited

U.S. PATENT DOCUMENTS

| 4,866,841 | A | * | 9/1989 | Hubbard | 29/845 |
| 6,049,039 | A | * | 4/2000 | Fushimi | 174/68.1 |
| 6,300,678 | B1 | * | 10/2001 | Suehiro et al. | 257/697 |
| 6,359,332 | B2 | | 3/2002 | Shiraishi | |
| 2001/0015491 | A1 | * | 8/2001 | Shiraishi | 257/697 |

FOREIGN PATENT DOCUMENTS
JP 9-55244 2/1997

OTHER PUBLICATIONS
Korean Office Action issued Feb. 9, 2011 in corresponding Korean Patent Application 10-2009-0089706.

* cited by examiner

*Primary Examiner* — Timothy Thompson
*Assistant Examiner* — Sherman Ng

(57) ABSTRACT

A lead pin for a package substrate includes a coupling pin, a head portion, and a flowing prevention portion. The coupling pin is to be inserted into a hole which is formed in an external substrate. The head portion is formed at one end of the coupling pin. The flowing prevention portion is formed on the top surface of the head portion and prevents a solder paste from flowing toward the coupling pin on the top surface of the head portion when the head portion is mounted on the package substrate.

7 Claims, 6 Drawing Sheets

LEAD PIN FOR PACKAGE SUBSTRATE

CROSS-REFERENCE TO RELATED APPLICATIONS

This application claims the priority of Korean Patent Application No. 10-2009-0089706 filed on Sep. 22, 2009, in the Korean Intellectual Property Office, the disclosure of which is incorporated herein by reference.

BACKGROUND OF THE INVENTION

1. Field of the Invention

The present invention relates to a lead pin for a package substrate, and more particularly, to a lead pin for a package substrate, which connects the package substrate, on which an integrated circuit (IC) is mounted, to a main board.

2. Description of the Related Art

As the electronics industry has developed, various types of semiconductor packages have been manufactured. As interconnections for semiconductor packages have become highly dense, a Pin Grid Array (PGA) semiconductor package substrate on which a plurality of T-type lead pins are installed is widely used as a substrate which connects a package substrate, on which an IC is mounted, to a main board.

A typical package substrate generally uses an insertion-type pin, which is inserted into a through-hole, and a T-type lead pin, which is attached to a package substrate by soldering. Compared with the insertion-type pin, the T-type lead pin is commonly used because there is less limitation on the circuit configuration of the package substrate.

Since the use of Pb has recently been restricted due to the consideration of environmental impact of soldering, a Pb-free solder such as Sn—Ag—Cu or Sn—Sb is used. Thus, a solder melting temperature is high.

As the solder melting temperature increases, a solder which supports a lead pin may be melted by reflow heat during a reflow process for mounting an IC chip on a package substrate, causing the lead pin to be inclined.

Furthermore, a solder often flows over the top surface of the lead pin and then flows toward the coupling pin during the reflow process. Therefore, there is a need for technologies which can solve these problems.

SUMMARY OF THE INVENTION

An aspect of the present invention provides a lead pin for a package substrate, which prevents a coupling pin from being contaminated by a solder paste.

According to an aspect of the present invention, there is provided a lead pin for a package substrate, including: a coupling pin to be inserted into a hole which is formed in an external substrate; a head portion formed at one end of the coupling pin; and a flowing prevention portion formed on the top surface of the head portion and preventing a solder paste from flowing toward the coupling pin on the top surface of the head portion when the head portion is mounted on the package substrate.

The flowing prevention portion may be formed in a region corresponding to a distance of about 1/10 to 1/2 of the way inwards the outer radius of the top surface of the head portion.

The flowing prevention portion may include a protrusion which protrudes on the top surface of the head portion.

The flowing prevention portion may include a groove section which is recessed inwardly from the top surface of the head portion.

The groove section may include: a vertical part formed parallel to the coupling pin; and a horizontal part integrally formed with the vertical part.

The head portion may include: a disk-shaped flange section formed at one end of the coupling portion; and a hemispherical round section formed on the bottom surface of the flange section, the area of the round section being smaller than the area of the flange section.

The curvature of a region of the head portion which corresponds to the diameter of the coupling pin may be equal to or greater than the curvature of the head portion which connects ends of the head portion.

The head portion may include: a disk-shaped flange section formed at one end of the head portion; and a hemispherical round section protruding from one surface of the flange section, the center height of the round section being greater than the height of the flange section.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
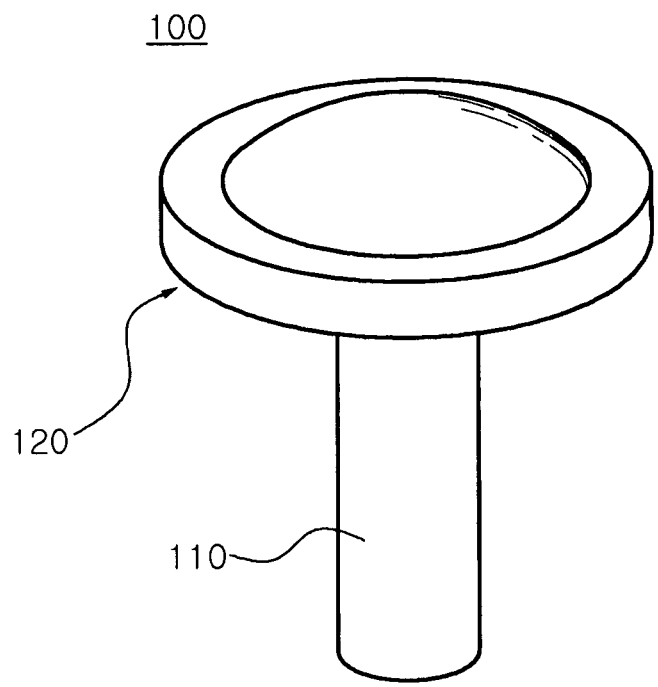
FIG. 1 is a perspective view of a lead pin for a package substrate according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

A lead pin for a package substrate according to embodiments of the present invention will be described below in detail with reference to FIGS. 1 to 9.

Figure 2:
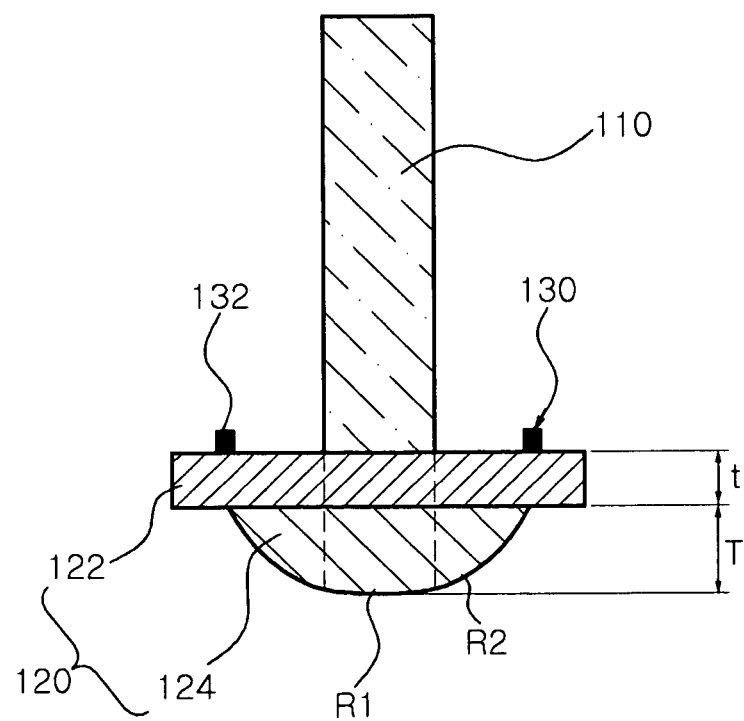
FIG. 2 is a cross-sectional view of the lead pin of FIG. 1.
Figure 3:
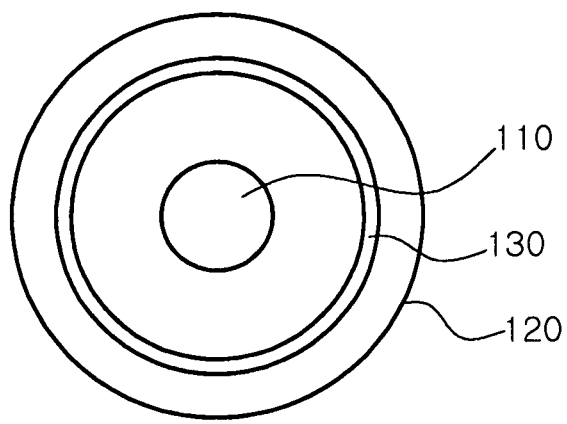
FIGS. 3 and 4 are a plan view and a bottom view of the lead pin of FIG. 1, respectively.
Figure 4:
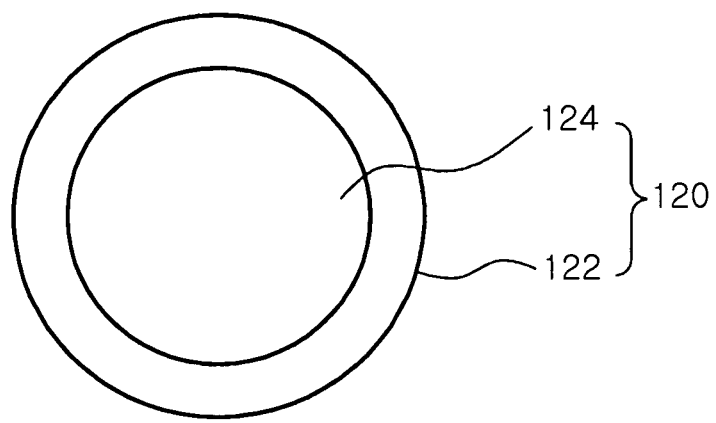
Figure 5:
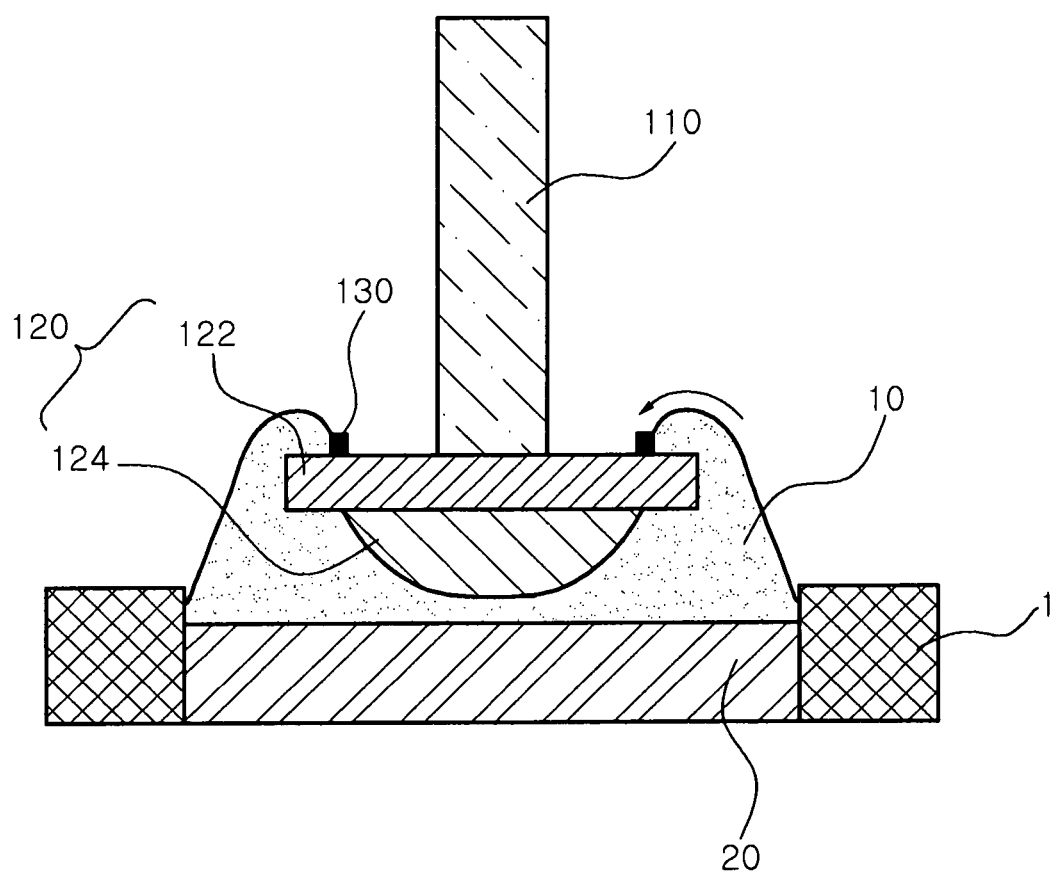
FIG. 5 is a cross-sectional view illustrating the lead pin of FIG. 1 which is mounted on a package substrate.

FIG. 1 is a perspective view of a lead pin for a package substrate according to an embodiment of the present invention. FIG. 2 is a cross-sectional view of the lead pin of FIG. 1. FIGS. 3 and 4 are a plan view and a bottom view of the lead pin of FIG. 1, respectively. FIG. 5 is a cross-sectional view of the lead pin of FIG. 1 which is mounted on a package substrate 1.

Referring to FIGS. 1 to 5, a lead pin 100 for a package substrate may include a coupling pin 110, a head portion 120, and a flowing prevention portion 130.

The coupling pin 110 is a portion which is to be inserted into a socket or the like when the lead pin 100 is mounted on the package substrate 1. The coupling pin 110 may be formed in a cylindrical shape with a predetermined length, depending on the type of the package substrate 1. When the lead pin 110 is mounted, the coupling pin 110 is connected in such a manner that it protrudes upward from the package substrate 1.

The coupling pin 110 is connected to one end of the head portion 120. The center of the head portion 120 may coincide with the center of the coupling pin 110.

The coupling pin 110 and the head portion 120 may be integrally formed, and may be made of the same conductive metal. However, the materials of the coupling pin 110 and the head portion 120 are not limited to the conductive metal.

As described above, the head portion 120 is integrally formed with the coupling pin 110 and is electrically connected to a region, where a pad 20 of the package substrate is exposed, by a solder paste 10.

The head portion 120 includes a disk-shaped flange section 122 and a hemispherical round section 124, which are sequentially formed at one end of the coupling pin 110. The hemispherical round section 124 is mounted such that it comes into contact with the pad 20 of the package substrate 1.

The diameter of the flange section 122 may be greater than the diameter of the hemispherical round section 124 which is disposed under the flange section 122. Therefore, when the head portion 120 is attached to the pad 20, the solder paste 10 flows into a space between the bottom surface of the flange section 122 and the outer periphery of the round section 124. The solder paste 10 may flow over the top surface of the flange section 122. However, the diameter difference between the flange section 122 and the round section 124 may prevent the overflow of the solder paste 10.

The curvature of a region R1 of the round section 124 which corresponds to the diameter of the coupling pin 110 is equal to or greater than the curvature of a region R2 which connects end portions of the round section 124. However, the round section 124 is not limited to this structure. The round section 124 may be formed to have a single curvature.

Therefore, the center portion of the round section 124 may be more gently sloped than its peripheral portions. The round section 124 may primarily prevent the lead pin 100 from being inclined. The structure of the round section 124 having the above-described curvature radius may cause air bubbles to flow out from the solder paste 10.

In addition, the flange section 122 and the round section 124 of the head portion 120 may be formed with different heights t and T, respectively. The center height T of the round section 124 formed with the predetermined curvature may be greater than the height t of the flange section 122.

The center height T of the round section 124 is formed to be greater than the height t of the flange section 122 in order to increase the contact area between the solder paste 10 surrounding the head portion 120 and the curved surface of the round section 124 within a design range of the head portion 120 when the head portion 120 is mounted on the package substrate 1.

Therefore, the coupling pin 110 may be vertically installed without being inclined on the package substrate 1. Moreover, the increased contact area may improve the performance of attachment.

The solder paste 10 includes a Pb/Zn/Ag alloy. When heat is applied to the solder paste 10, the solder paste 10 is melted into a viscous liquid phase. Then, the solder paste 10 is hardened in the melted shape by room temperature cooling, and is mutually attached to a target object in the hardened state.

The flowing prevention portion 130 includes a protrusion 132 which protrudes on the top surface of the head portion 120. The section of the flowing prevention portion 130 may be rectangular. However, the section of the flowing prevention portion 130 is not limited to the rectangular shape. For example, the section of the flowing prevention portion 130 may be circular, triangular, semicircular, hexagonal, octagonal, or polygonal.

The flowing prevention portion 130 may be formed in a region corresponding to a distance of about 1/10 to 1/2 of the way inwards from the outer radius of the top surface of the head portion 120.

If the flowing prevention portion 130 is formed very close to the coupling pin 110, it is highly like that the solder paste 10 will flow over the flowing prevention portion 130 and thus contaminate the coupling pin 110. Hence, the flowing prevention portion 130 may be formed on the top surface of the head portion 120 within the above-described range.

As illustrated in FIG. 5, the solder paste 10 moves to cover the top surface of the flange section 122 during the reflow process.

In the absence of the flowing prevention portion 130, the coupling pin 110 is also contaminated if the solder paste 10 moves to cover the top surface of the head portion 120.

However, the flowing prevention portion 130 formed on the top surface of the head portion 120 prevents the solder paste 10 from flowing toward the coupling pin 110 in the direction of the arrow depicted in FIG. 5, thus preventing the contamination of the coupling pin 110.

Since the lead pin 100 for the package substrate according to this embodiment of the present invention includes the flowing prevention portion 130 on the top surface of the head portion 120, it is possible to prevent the solder paste 10 from flowing over the top surface of the head portion 120 and flowing toward the coupling pin 110 during the reflow process. Hence, the contamination of the coupling pin 110 may be prevented.

Figure 6A:
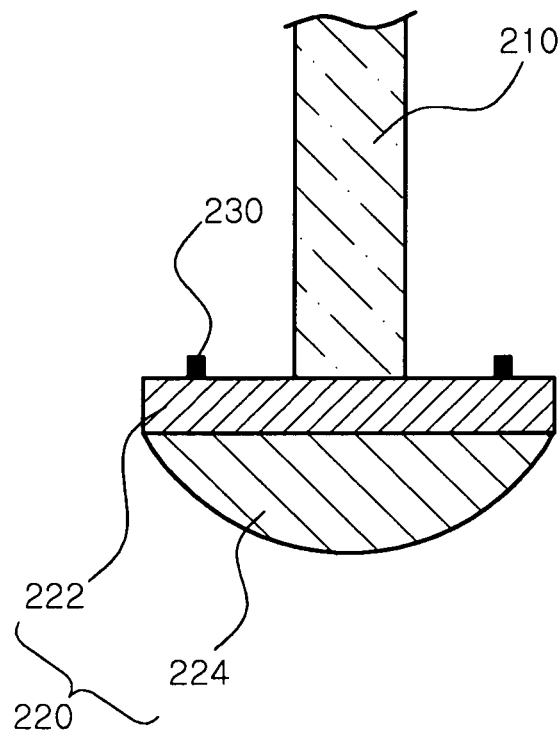
FIGS. 6A and 6B are cross-sectional views of a lead pin for a package substrate according to another embodiment of the present invention.
Figure 6B:
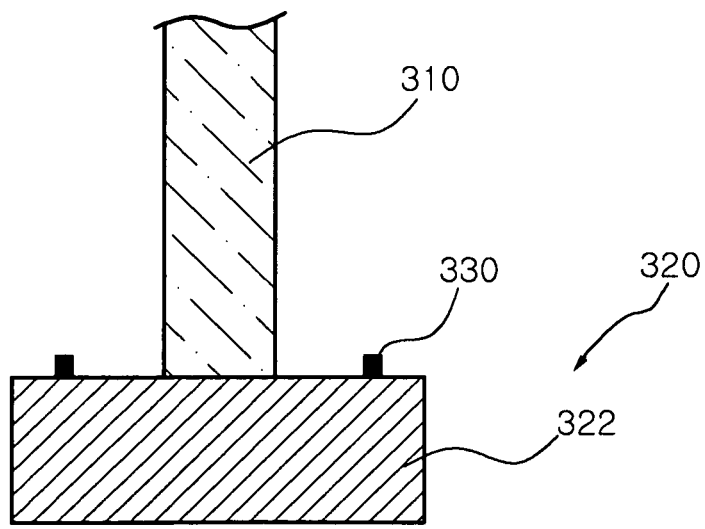

FIGS. 6A and 6B are cross-sectional views of a lead pin for a package substrate according to another embodiment of the present invention.

Referring to FIG. 6A, a head portion 220 is integrally formed with a coupling pin 210 and is electrically connected to a region, where a pad of a package substrate is exposed, by a solder paste.

The head portion 220 may include a disk-shaped flange section 222 and a cylindrical round section 224 having the same diameter as the flange section 222.

In addition, a flowing prevention portion 230 is formed to protrude on the top surface of the head portion 220. The section of the flowing prevention portion 230 may be rectangular.

Referring to FIG. 6B, a head portion 320 includes a disk-shaped flange section 322, without a hemispherical round section. Such a structure may prevent the head portion 320 from being inclined during a reflow process.

In addition, a flowing prevention portion 330 is formed to protrude on the top surface of the head portion 320. The section of the flowing prevention portion 330 may be rectangular.

Since the lead pin for the package substrate according to this embodiment of the present invention includes the flowing prevention portions 230 and 330 on the top surface of the head portions 220 and 320, the contamination of the coupling pins 210 and 310 may be prevented by the flowing prevention portions 230 and 330.

Figure 7:
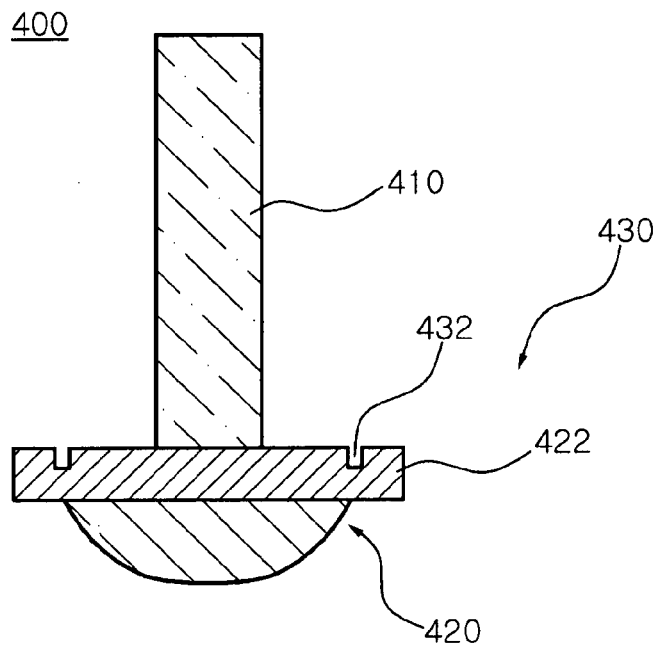
FIGS. 7 and 8 are cross-sectional views of a lead pin for a package substrate according to another embodiment of the present invention.
Figure 8:
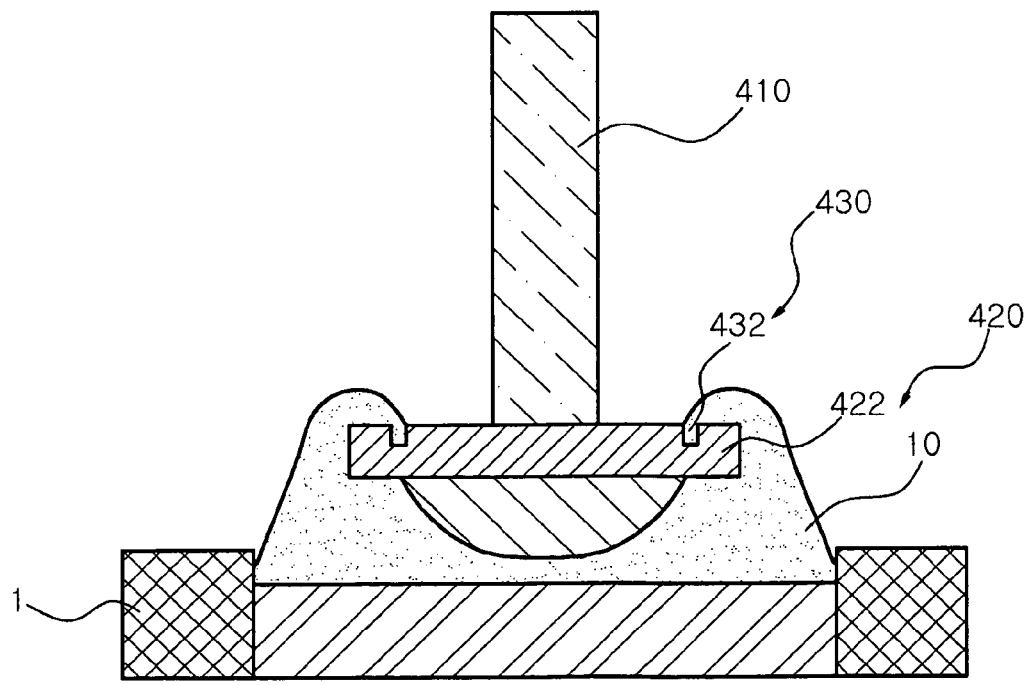

FIGS. 7 and 8 are cross-sectional views of a lead pin for a package substrate according to another embodiment of the present invention.

Referring to FIGS. 7 and 8, the lead pin 400 for the package substrate may include a coupling pin 410, a head portion 420, and a flowing prevention portion 430.

Since the coupling pin 410 and the head portion 420 are substantially identical to those of the above-described embodiments, detailed descriptions thereof will be omitted.

The flowing prevention portion 430 may include a groove section 432 recessed inwardly from the top surface of the head portion 420. The groove section 432 may be formed in a circular shape corresponding to a shape of a disk-shaped flange section 422.

As illustrated in FIG. 8, a solder paste 10 flows over the top surface of the head portion 420 and then flows toward the coupling pin 410. However, since the groove section 432 is formed in the path of movement of the solder paste 10, the solder paste 10 flows into the inner space of the groove section 432.

The solder paste 10 which flows into the groove section 432 may improve the performance of the attachment between the lead pin 400 and the package substrate 1.

Figure 9:
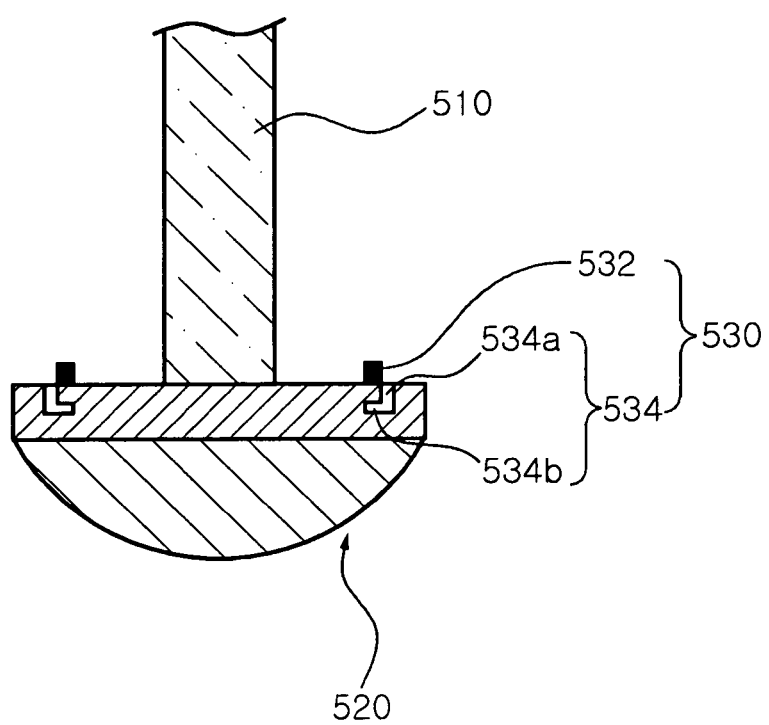
FIG. 9 is a cross-sectional view of a lead pin for a package substrate according to another embodiment of the present invention.

FIG. 9 is a cross-sectional view of a lead pin for a package substrate according to another embodiment of the present invention.

Referring to FIG. 9, a flowing prevention portion 530 may include a protrusion section 532, which protrudes on the top surface of a head portion 520, and a groove section 534, which is disposed adjacent to the protrusion section 532 and recessed inwardly from the top surface of the head portion 520.

In this case, the groove section 534 may include a vertical part 534a, which is formed parallel to the coupling pin 510, and a horizontal part 534b, which is integrally formed with the vertical part 534a.

Therefore, when the solder paste flows over the top surface of the head portion 520, it flows into the groove section 534. The remaining solder paste which does not flow into the groove section 534 may be prevented from flowing toward the coupling pin 510 by the protrusion section 532.

When the solder paste moves along the topology of the groove section 534, the attachment area is increased by the vertical part 534a and the horizontal part 534b. Even though external impact is applied in any direction, the lead pin is supported by the solder paste filled in the vertical part 534a and the horizontal part 534b, thereby increasing the performance of the attachment therebetween.

As set forth above, according to exemplary embodiments of the invention, since the lead pin for the package substrate includes the flowing prevention portion on the top surface of the head portion, it is possible to prevent the solder paste from flowing over the top surface of the head portion and flowing toward the coupling pin during the reflow process. Hence, the contamination of the coupling pin may be prevented.

While the present invention has been shown and described in connection with the exemplary embodiments, it will be apparent to those skilled in the art that modifications and variations can be made without departing from the spirit and scope of the invention as defined by the appended claims.

What is claimed is:

1. A lead pin for a package substrate, comprising:
a coupling pin to be inserted into a hole which is formed in an external substrate;
a head portion formed at one end of the coupling pin; and
a flowing prevention portion formed on the top surface of the head portion and preventing a solder paste from flowing toward the coupling pin on the top surface of the head portion when the head portion is mounted on the package substrate,
the curvature of a region of the head portion which corresponds to the diameter of the coupling pin being equal to or greater than the curvature of the head portion which connects ends of the head portion.

2. A lead pin for a package substrate, comprising:
a coupling pin to be inserted into a hole which is formed in a n external substrate;
a head portion formed at one end of the coupling pin; and
a flow prevention portion formed on the top surface of the head portion and preventing a solder paste from flowing toward the coupling pin on the top surface of the head portion when the head portion is mounted on the package substrate,
the flow prevention portion being in a region corresponding to a distance of about $1/10$ to $1/2$ of the way inwards from the outer radius of the top surface of the head portion.

3. The lead pin of claim 1, wherein the flowing prevention portion comprises a protrusion which protrudes on the top surface of the head portion.

4. The lead pin of claim 1, wherein the flowing prevention portion comprises a groove section which is recessed inwardly from the top surface of the head portion.

5. A lead pin for a package substrate, comprising:
a coupling pin to be inserted into a hole which is formed in an external substrate;
a head portion formed at one end of the coupling pin; and
a flow prevention portion formed on the top surface of the head portion and preventing a solder paste from flowing toward the coupling pin on the top surface of the head portion when the head portion is mounted on the package substrate,
the flow prevention portion comprising a groove section which is recessed inwardly from the top surface of the head portion, and
the groove section comprising
a vertical part formed parallel to the coupling pin, and
a horizontal part integrally formed with the vertical part.

6. The lead pin of claim 1, wherein the head portion comprises:
a disk-shaped flange section formed at one end of the coupling portion; and
a hemispherical round section formed on the bottom surface of the flange section, the area of the round section being smaller than the area of the flange section.

7. The lead pin of claim 1, wherein the head portion comprises:
a disk-shaped flange section formed at one end of the head portion; and
a hemispherical round section protruding from one surface of the flange section, the center height of the round section being greater than the height of the flange section.

* * * * *

UNITED STATES PATENT AND TRADEMARK OFFICE
CERTIFICATE OF CORRECTION

| | |
|---|---|
| PATENT NO. | : 8,420,955 B2 |
| APPLICATION NO. | : 12/805413 |
| DATED | : April 16, 2013 |
| INVENTOR(S) | : Jin Won Choi et al. |

It is certified that error appears in the above-identified patent and that said Letters Patent is hereby corrected as shown below:

In the Claims:

Column 6, Line 16, In Claim 2, delete "a n" and insert -- an --, therefor.

Signed and Sealed this
Tenth Day of September, 2013

Teresa Stanek Rea
*Acting Director of the United States Patent and Trademark Office*